US009010409B2

(12) United States Patent
De Bruyker et al.

(10) Patent No.: US 9,010,409 B2
(45) Date of Patent: Apr. 21, 2015

(54) THERMAL SWITCH USING MOVING DROPLETS

(75) Inventors: Dirk De Bruyker, San Jose, CA (US); David Eric Schwartz, San Carlos, CA (US); Ricardo Santos Roque, Sunnyvale, CA (US); Sean Roark Garner, San Francisco, CA (US); Matthew D. Eisaman, Redwood City, CA (US); Joseph Robert Johnson, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 622 days.

(21) Appl. No.: 13/299,729

(22) Filed: Nov. 18, 2011

(65) Prior Publication Data

US 2013/0126003 A1     May 23, 2013

(51) Int. Cl.
    *F28F 7/00*     (2006.01)
    *H01L 23/34*     (2006.01)
    *F28F 13/00*     (2006.01)

(52) U.S. Cl.
    CPC ........... *H01L 23/34* (2013.01); *F28F 2013/008* (2013.01); *H01L 2924/0002* (2013.01)

(58) Field of Classification Search
    USPC .............. 165/185, 276, 86, 277, 96; 361/709, 361/707, 704, 679.53, 679.46, 719; 337/298; 335/58
    See application file for complete search history.

(56) References Cited

U.S. PATENT DOCUMENTS

| | | | | | |
|---|---|---|---|---|---|
| 3,302,703 | A | * | 2/1967 | Kelly | 165/135 |
| 3,957,107 | A | * | 5/1976 | Altoz et al. | 165/276 |
| 4,212,346 | A | * | 7/1980 | Boyd | 165/277 |
| 5,379,601 | A | * | 1/1995 | Gillett | 62/51.1 |
| 5,445,308 | A | * | 8/1995 | Nelson et al. | 228/121 |
| 5,966,941 | A | * | 10/1999 | Ghoshal | 62/3.7 |
| 6,665,186 | B1 | * | 12/2003 | Calmidi et al. | 361/704 |
| 6,768,412 | B2 | * | 7/2004 | Becka et al. | 337/36 |
| 6,804,966 | B1 | * | 10/2004 | Chu et al. | 62/3.7 |
| 6,871,538 | B2 | * | 3/2005 | Fujiwara et al. | 73/204.26 |
| 6,876,130 | B2 | * | 4/2005 | Wong et al. | 310/328 |
| 6,946,776 | B2 | * | 9/2005 | Fong et al. | 310/328 |
| 7,191,823 | B2 | * | 3/2007 | Harker et al. | 165/96 |
| 7,411,792 | B2 | * | 8/2008 | Richards et al. | 361/704 |
| 8,093,968 | B2 | * | 1/2012 | Naito | 335/78 |
| 8,286,696 | B2 | * | 10/2012 | Grayson et al. | 165/277 |
| 8,619,350 | B2 | * | 12/2013 | Lee et al. | 359/245 |
| 8,659,903 | B2 | * | 2/2014 | Schwartz | 361/719 |
| 2007/0205473 | A1 | * | 9/2007 | Youngner et al. | 257/414 |
| 2007/0257766 | A1 | * | 11/2007 | Richards et al. | 337/298 |
| 2013/0141207 | A1 | * | 6/2013 | Schwartz et al. | 337/298 |

* cited by examiner

*Primary Examiner* — Marc Norman
*Assistant Examiner* — Devon Russell
(74) *Attorney, Agent, or Firm* — Marger Johnson & McCollom PC

(57) ABSTRACT

A thermal switch has a first substrate, a thermally conductive region on the first substrate, a thermally insulative region on the first substrate adjacent the thermally conductive region, a second substrate arranged adjacent the first substrate, a droplet of thermally conductive liquid between the first and second substrate adjacent the thermally conductive region and the thermally insulative region, and an actuator arranged on one of the first or second substrates to cause the droplet to move between the thermally conductive region and the thermally insulative region on the first substrate.

12 Claims, 6 Drawing Sheets

US 9,010,409 B2

THERMAL SWITCH USING MOVING DROPLETS

BACKGROUND

Active thermal switches operate between states of thermal conductivity during which the switch transfers heat, and thermal insulation during which the switch does not conducts less heat. Miniaturized and/or arrayed active thermal switches could enable a range of new applications, including improving thermal management of integrated circuits and chip packages and new energy concepts. Current approaches have been unable to achieve distinct thermal contrast between the high heat conducting state and the low heat conducting state with small form-factors and fast actuation at temperatures suitable for energy harvesting or cooling applications.

Issues may arise with thermal switches and their thermal conductivity contrast, switching speed, and the ease or difficulty of construction. Thermal conductivity contrast means the difference between the thermal conductivity with the switch on versus the thermal conductivity with the switch off. Many current approaches do not have good contrast. Similarly, many approaches have slow switching speeds between the thermal switch being on and off. Finally, many thermal switches have very complicated manufacturing processes, and use materials that can be difficult to handle or materials that are expensive.

DETAILED DESCRIPTION OF THE EMBODIMENTS

Figure 1:
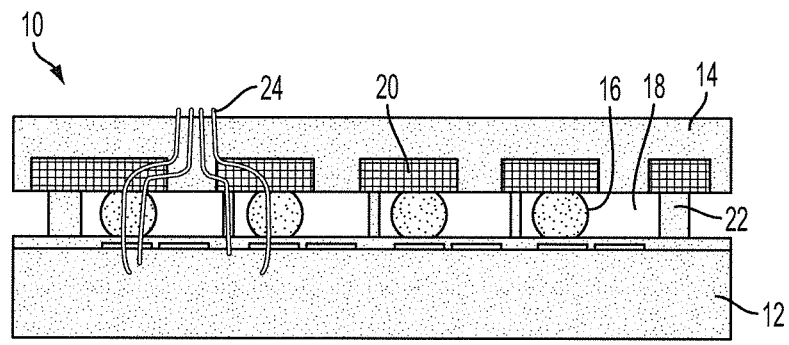
FIG. 1 shows an embodiment of an array of active thermal switches in an OFF state.

FIG. 1 shows an embodiment of an active thermal switch 10. One should note that several modifications and variations exist. This embodiment is intended to serve as an example with no limitation intended on the scope of the claims. In this embodiment, the thermal switch resides in an array of thermal switches, which may be operated together as one larger switch, or operated individually, but the discussion will focus on only one of those switches. The switch generally consists of a first substrate, referred to as an active plate, 12, and a second substrate, referred to as a thermal contrast plate, 14. Liquid droplets such as of thermally conductive material lie between the two substrates and have the capability to move between thermally conductive regions 18 and thermally insulative regions such as 20. Spacers, such as 22, have an extent necessary to allow droplets of sufficient size to conduct heat to reside between the two substrates.

The droplet serves to connect the active plate with the thermal contrast plate through one or the other type of region. In FIG. 1, the embodiment shows a thermal switch in the OFF state. The droplet holds a position between the thermally insulative region 20 in the thermal contrast plate and the active plate 12. Heat in the thermal contrast plate will not travel to the active plate through the droplet because the insulative region will not conduct the heat, or will conduct the heat at a very low level. Heat in the active plate will travel through the droplet to the thermal contrast plate but will then encounter the insulative region, which will not conduct heat any at significant level.

Figure 2:
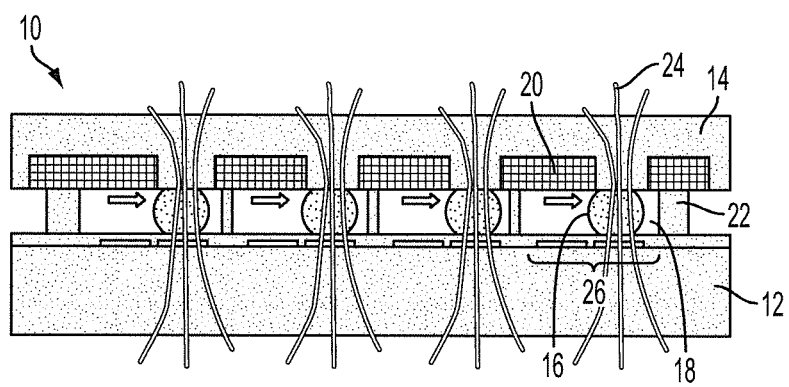
FIG. 2 shows an embodiment of an array of active thermal switches in an ON state.

FIG. 2 shows an embodiment of a thermal switch in the ON state. The active plate 12 includes an actuator that causes the droplet to move between the ON state and the OFF state. In this particular embodiment, the actuator consists of a set of electrodes 26. Selective activation of the electrodes and control of their respective voltages cause the droplet to move between the ON position and the OFF position, and to hold the position. In FIG. 2, the electrodes received signals that caused the droplet to move away from the OFF electrode and towards the ON electrode.

With the movement of the droplet to the thermally conductive region 18, heat will now conduct between the two plates through the droplet and thermally conductive region. FIG. 2 shows this by the heat flux lines 24.

Figure 3:
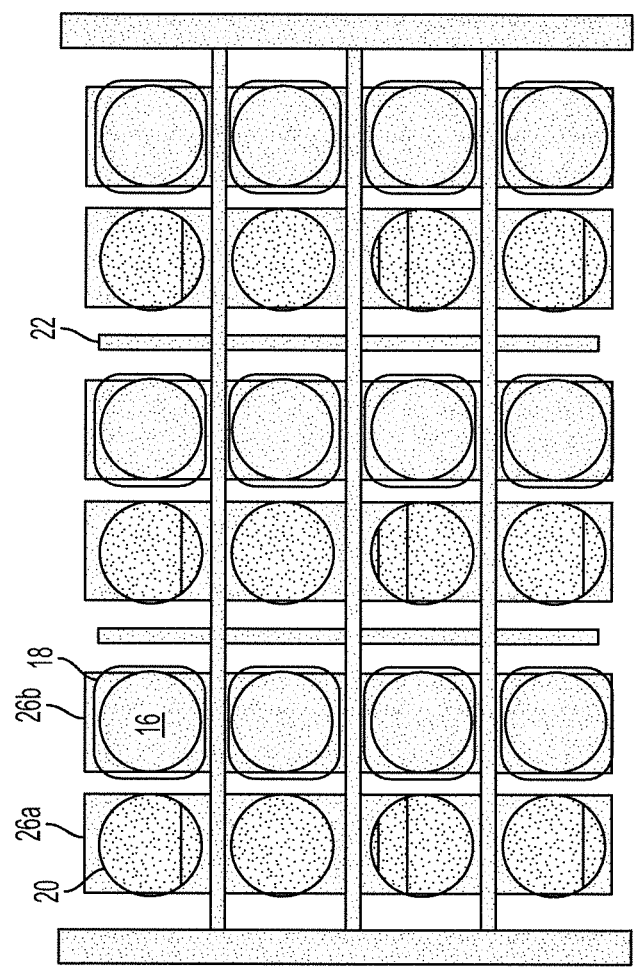
FIG. 3 shows a top view of an embodiment of an array of active thermal switches.

As discussed previously, the thermal switch in FIGS. 1 and 2 are part of an array of thermal switches. A spacer such as 22 separates the first and second substrates and may have a further advantage of defining the extent of each switch. The individual addressing of each switch may take a form very similar to memory array addressing, or display panel element array addressing. Such a form may include row and column address lines, 'word' and 'bit' line addressing such as those used in memory array addressing. FIG. 3 shows such an example.

In FIG. 3, the electrodes 26a for the thermally insulative regions 20 and the electrodes such as 26b for thermally conductive regions 18 are shown as being connected together. This mimics the addressing schemes discussed above. In the particular embodiment shown here, the thermally insulative regions 20 consist of porous silicon regions formed in the thermal contrast plate. The thermal contrast plate may consist of a silicon wafer that has undergone an alteration such as etching to form the porous regions. The discussion now turns to the materials and manufacturing of the thermal switches.

Figure 4:
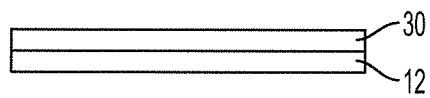
FIGS. 4-13 show an embodiment of a method of manufacturing an active plate for an array of thermal switches.
Figure 5:
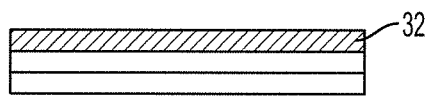

FIGS. 4-13 show a process for manufacturing an embodiment of the active plate. In FIG. 4, the active plate substrate consists of a silicon wafer. However, any type of substrate upon which can be formed metal and other layers would work as well. The substrate should have a high thermal conductance from bottom to top, which is the heat flow path. In the embodiment of FIG. 4, the substrate has a dielectric layer 30, such as silicon dioxide, upon it. The electrode layer 32 in FIG. 5 consists of molybdenum on a chromium adhesion layer, but may consist of any material having a high electrical conductivity.

Figure 6:
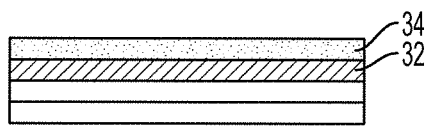
Figure 7:
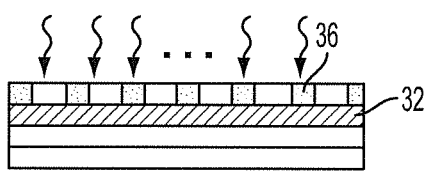
Figure 8:
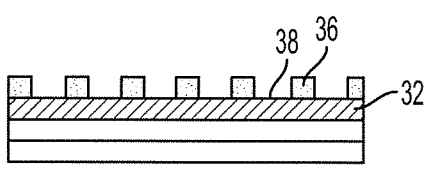

FIGS. 6-9 show one example of a photolithography process to form the electrodes, with the understanding that any such process may form the electrodes. In FIG. 6, a layer of photoresist 34 covers the electrode layer 32. Light directed towards the photoresist layer selectively cures regions of the photoresist such as region 36. An etching or cleaning process removes the uncured portions of the photoresist, leaving regions such as 36, and exposing regions of the electrode layer 32 such as 38.

Figure 9:
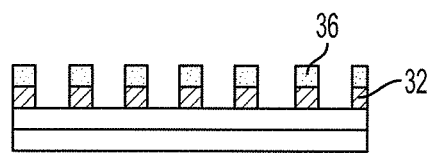
Figure 10:
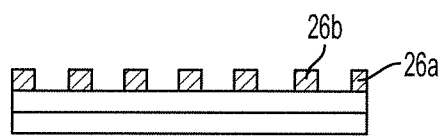
Figure 11:
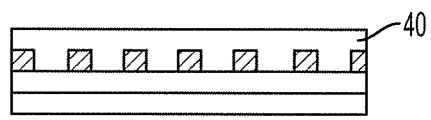
Figure 12:
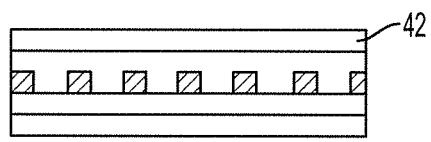

An etch process then removes portions of the electrode layer 32 that have no protection, while the protected regions such as that under region 36 remain, as shown in FIG. 9. The cured photoresist regions are then removed, leaving electrodes formed on the dielectric coating, such as electrodes 26a and 26b in FIG. 10. This demonstrates one method of forming electrodes. They can result from other processes, such as printing or laminating.

Once the electrodes are formed, by whatever process, they receive a dielectric coating 40. This separates the electrodes from the droplet of liquid. In order to respond to electrical actuation, the droplet has some electrical conductivity. Without the coating 40, the droplet could cause the electrodes to short, as will be discussed in more detail later.

The process may include an optional hydrophobic coating 42. Once the droplet becomes trapped between the two substrates and the spacers, no means to refresh the droplet exists. A hydrophobic coating will increase the mobility of the drops on the surface, decreasing the time and/or force needed for switching. As a secondary benefit, the hydrophobic coating can prevent the substrate from absorbing any of the drop, which would diminish the size of the drop reducing its effectiveness as a thermal conductor. The hydrophobic coating may consist of Teflon®, or a superhydrophobic surface, such as textured surfaces. However, a textured surface may reduce the thermal contact between the drop and the surface.

Figure 13:
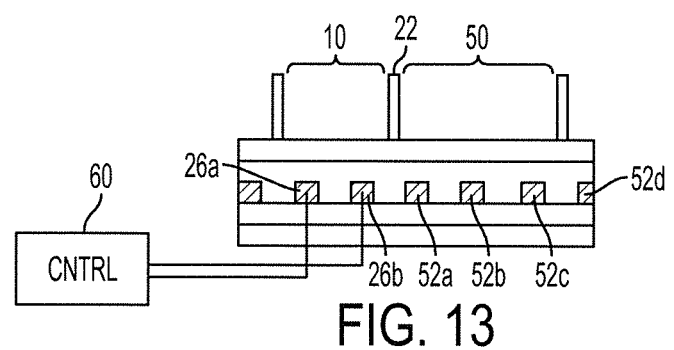

FIG. 13 shows two thermal switches having slightly different architectures. It should be noted that these architectures would not reside in the same array; they do so here for simplicity. Similarly, the placement of the spacers 22 dictate the number of electrodes in these drawings, but the spacing may remain the same between the two architectures. The spacer layer may consist of SU-8, a photopatternable polymer, which can result from patterning on the active plate. The spacer layer should have low thermal conductivity to avoid a parasitic path of heat conduction parallel to the drops. It should also have a high enough mechanical strength to maintain a rigid separation between the plates.

The thermal switch 10 has two electrodes 26a and 26b, used to position the droplet adjacent the thermally insulative or thermally conductive regions on the contrast plate. The thermal switch 50 has several electrodes. These different architectures have different electrical actuation methods using electrodes. Other actuation methods also exist, including electrowetting, electrokinetic effects, magnetic actuation using ferroliquids, etc.

For example, the thermal switch 10 will generally involve having the liquid droplet in electrical contact with one electrode, typically a ground electrode. The droplet then capacitively couples to switching electrodes such that the droplet forms one 'plate' of a capacitor. When a controller, such as 60, applies a potential between the grounded droplet and one of the electrodes 26a or 26b, an electrostatic force between the droplet and the active electrode will cause the droplet to move to a position above the active electrode. This architecture also has an impact on the formation of the thermal contrast plate, as the underside of the thermal contrast plate that faces the active plate will require a conductive coating of some kind to act as the ground electrode. This coating should be sufficiently thick to obtain high enough lateral electrical conductance for fast switching, yet not so thick as to obtain high lateral thermal conductance, which reduces the heat blocking capability of the switch in the off state. This will be referred to as the 'single capacitor' approach.

In contrast, the thermal switch 50 has multiple electrodes, 52a-d. When the controller applies a potential across a pair of electrodes, two capacitors form in series. One between the first electrode and the droplet, the other between the second electrode and the droplet. The droplet will tend to move to equalize the capacitances between itself and each electrode because of the electrostatic force generated. Typically, the area of a droplet cross-section will be greater than the area of an electrode. This will be referred to as the 'series capacitor' approach. To move droplets between the thermal contrast regions, the controller activates multiple electrodes per droplet such that the droplet is moved successively from one to another.

The voltage applied may vary from approximately 10 volts or less to 100 volts or more. Both AC and DC voltages can work, although the DC voltages should have a sharp edge. AC voltages in the range of one to less than one hundred Hz seemed to work most effectively. The voltages needed depend upon the material of the droplet.

The droplets may be aqueous, such as a solution with a high concentration of salt, or metallic liquid, such as mercury or indium-gallium alloys, such as Indalloy™. Liquid metals have an advantage in their high thermal and electrical conductivity. Indium-gallium alloys also have an advantage that they have fewer environmental concerns than mercury. However, they are incompatible with many common materials and also droplets tend to form an oxide layer on their surface, which impedes their mobility. The below table lists the thermal conductivities of these materials and some of the materials involved.

| Material | K (W/mk) |
| --- | --- |
| Si (single crystal silicon) | 149 |
| Copper | 401 |
| Porous Si (70% porosity approx.) | 0.1 |
| Water | 0.6 |
| Air | 0.025 |
| Liquid mercury (at 20 C.) | 7.9 |
| Liquid gallium (at 30 C.) | 24 |
| Indalloy 117 (at 47 C.) | 15 |
| SU-8 | 0.2 |

Figure 14:
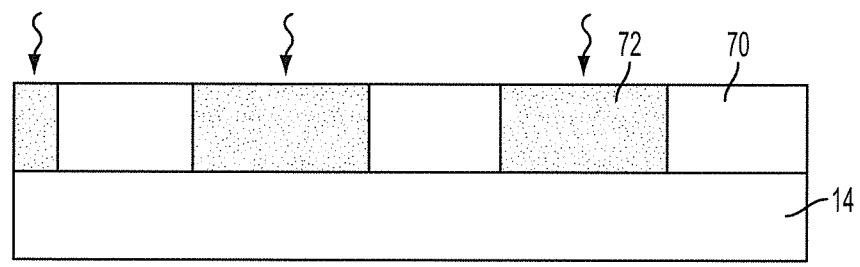
FIGS. 14-16 show an embodiment of a method of manufacturing a thermal contrast plate.
Figure 15:
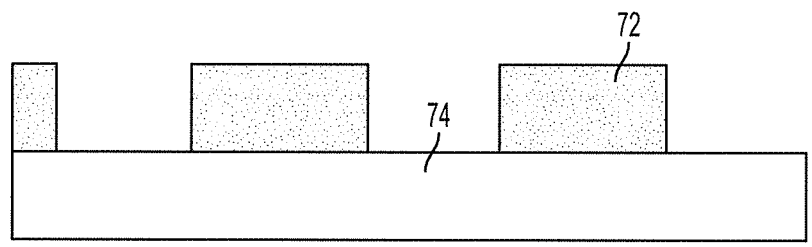
Figure 16:
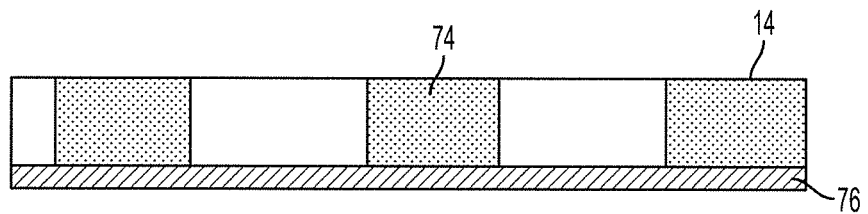

Some of the materials above relate to the thermal contrast plate. FIGS. 14-16 show an embodiment of a method of forming a thermal contrast plate using a wafer of silicon, typically single crystal silicon. In FIG. 14 the thermal contrast plate substrate 14 receives a layer of photoresist 70 in which selective regions such as 72 receive light to cure those regions.

FIG. 15 shows the uncured regions of the photoresist 70 having been removed, leaving the cured regions such as 72 and exposed regions such as 74 of the substrate 14. A traditional etching process may be applied that alters the exposed regions to increase their porosity. Alternatively, the photoresist masking process may not be necessary and a selective electromechanical etching process applied to the regions to form regions in the substrate 14 having high porosity, approximately 70% porous.

FIG. 16 shows the resulting thermal plate 14, having highly porous and thermally insulative regions 74, inverted from processing as it would be positioned before being joined to the active plate. If the architecture of the switch employs the single capacitor actuation scheme, the underside of the thermal contrast plate will require a conductive coating to allow it to act as the ground electrode, shown as layer 76 in FIG. 16. This thermal contrast plate would then mount to the spacer layer on the active plate after each region between the spacers receives the droplet of liquid.

Figure 17:
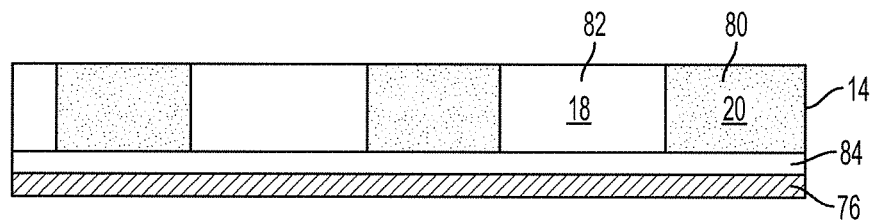
FIG. 17 shows an alternative embodiment of a thermal contrast plate.

FIG. 17 shows an alternative embodiment of a thermal contrast plate 14. In this embodiment, a substrate, which may be aluminum or other thermally conductive material, has grooves or recesses such as 80 formed within. The grooves or recesses could then be filled with a thermally insulative material, such as polyurethane, or a gas, such as air. If filled with gas, the recesses would be sealed by application of a membrane 84. If filled with a solid, they would optionally be smoothed. If the single capacitor embodiment is used, the membrane may be a metalized membrane, or a second metallic layer 76 would be applied. Many other alternatives exist for the thermal contrast plate. The thermally contrasting regions could consist of copper and glass or polymer.

In experiments, a lumped-element model was created to estimate the thermal conductivity k, $k_{on}/k_{off}$, using drops of roughly 250 nanoliters in size. A value of approximately 250 was obtained, with the on state of about $2\times10^4$ W/Km$^2$, assuming a fill factor of 0.85, which is the ratio of area that can be contacted by the drops to the total area. Switching speed is estimated to be about 1 millisecond.

The above thermal switches have several advantages. They have high thermal contrast, low total thermal resistance in the ON state, no moving parts except the fluid droplets, relatively fast switching, and low cost fabrication.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A thermal switch, comprising:
a first substrate;
a thermally conductive region on the first substrate;
a thermally insulative region on the first substrate adjacent the thermally conductive region;
a second substrate arranged adjacent the first substrate;
at least two spacers between the first and second substrates to separate the substrates, the spacers located with the thermally insulative and the thermally conductive regions between the spacers;
a droplet of electrically and thermally conductive liquid between the first and second substrates adjacent one of either the thermally conductive region and the thermally insulative region; and
at least two electrodes arranged together on the second substrate to generate electrostatic forces that cause the droplet to move between the thermally conductive region and the thermally insulative region on the first substrate wherein a dielectric coating separates the electrodes from the droplet.

2. The thermal switch of claim 1, wherein the spacers further comprises one of a photopatternable epoxy, Kapton, or SU-8.

3. The thermal switch of claim 1, wherein the thermal switch comprises one thermal switch in an array of thermal switches.

4. The thermal switch of claim 1, further comprising a controller in communication with the electrodes such that the controller can control the voltage of the electrodes.

5. The thermal switch of claim 1, wherein the thermally conductive region comprises a region of copper and the thermally insulative region comprises one of glass or a polymer.

6. The thermal switch of claim 1, wherein the thermally insulative region comprises a gas-filled cavity covered with a membrane.

7. The thermal switch of claim 1, wherein the droplet of thermally conductive liquid comprises one of solution with salt or a metallic liquid.

8. The thermal switch of claim 7, wherein the droplet comprises a metallic liquid selected from mercury, indium-gallium alloy, and gallium.

9. The thermal switch of claim 1, wherein the at least two electrodes comprise a first electrode arranged opposite the thermally conductive region and a second electrode arranged opposite the thermally insulative region.

10. The thermal switch of claim 9, wherein the first substrate has a conductive coating on a surface of the first substrate in contact with the conductive liquid.

11. The thermal switch of claim 9, wherein at least one of the first electrode and the second electrode comprises an array of electrodes.

12. The thermal switch of claim 1, wherein the first substrate comprises a metal plate having at least one groove filled with one of either a gas or a polymer to form the thermally insulative region.

* * * * *